United States Patent
Oh (10) Patent No.: US 7,643,806 B2
(45) Date of Patent: Jan. 5, 2010

(54) NETWORK SEARCHING IN A MOBILE COMMUNICATION TERMINAL

(75) Inventor: Hyung Suk Oh, Seoul (KR)

(73) Assignee: LG Electronics Inc., Seoul (KR)

( * ) Notice: Subject to any disclaimer, the term of this patent is extended or adjusted under 35 U.S.C. 154(b) by 461 days.

(21) Appl. No.: 11/470,474

(22) Filed: Sep. 6, 2006

(65) Prior Publication Data
US 2007/0060083 A1 Mar. 15, 2007

(30) Foreign Application Priority Data
Sep. 9, 2005 (KR) .................. 10-2005-0084276

(51) Int. Cl.
*H04B 1/18* (2006.01)
(52) U.S. Cl. .............. 455/164.2; 455/182.2; 455/192.2; 455/164.1
(58) Field of Classification Search .............. 455/164.2, 455/164.1, 182.2, 192.2
See application file for complete search history.

(56) References Cited

U.S. PATENT DOCUMENTS

| | | | | |
|---|---|---|---|---|
| 4,498,191 A | * | 2/1985 | Rogers | 455/164.2 |
| 4,941,204 A | * | 7/1990 | Zuffada et al. | 455/182.2 |
| 5,517,678 A | * | 5/1996 | Klank et al. | 455/182.2 |
| 5,552,749 A | * | 9/1996 | Nowatski et al. | 455/192.2 |
| 5,634,205 A | | 5/1997 | Kurisu et al. | |
| 6,067,332 A | * | 5/2000 | Taura et al. | 375/344 |
| 6,275,699 B1 | * | 8/2001 | Ichihara | 455/434 |
| 7,228,117 B2 | * | 6/2007 | Ichihara | 455/192.2 |

FOREIGN PATENT DOCUMENTS

CN 1514671 7/2004

OTHER PUBLICATIONS

Chinese IPO; Office Action in foreign application (CN 2006101516747) to which priority is claimed by the present application; Sep. 5, 2008.

* cited by examiner

*Primary Examiner*—Lana N Le
(74) *Attorney, Agent, or Firm*—Workman Nydegger (57) ABSTRACT

A network search method for a mobile communication terminal is disclosed. In one example embodiment, a mobile communication terminal employing a Digitally Controlled Crystal Oscillator (DCXO) performs a network search method including the act of searching for a frequency using a value stored in an Automatic Frequency Control (AFC) mode.

9 Claims, 5 Drawing Sheets

```
NET_R  759 68 0  0   0      0
ABORT  761 44 0  54970 382649 0 0 43528
FB_I   777 0  68 120 0   0   0 170 0 5
FB_I   793 0  68 116 0   0   0 169 0 5      B
FB_I   809 0  68 116 0   0   0 173 0 5
FB_I   825 0  68 118 0   0   0 176 0 5
FB_I   841 0  68 120 0   0   0 174 0 3000
FB_I   857 0  68 116 0   0   0 173 0 3000   C
FB_I   873 0  68 119 0   0   0 176 0 3000
FB_I   889 0  68 123 0   0   0 177 0 3000
FB_I   905 0  68 118 0   0   0 171 0 -3350
FB_I   921 0  68 115 0   0   0 173 0 -3350  D
FB_I   937 0  68 122 0   0   0 177 0 -3350
FB_I   953 0  68 116 0   0   0 173 0 -3350
NET_I  953 0  68 0   0   0
              A
```

FIG. 6

```
NET_R  2383 40  0  0   0  0
ABORT  2385 44  0  2386 2385 0 0 43528
FB_I   2401 0   40 115  0    0 0 126 0 5
FB_I   2417 0   40 121  0    0 0 127 0 5    F
FB_I   2433 0   40 116  0    0 0 125 0 5
FB_I   2449 0   40 117  0    0 0 125 0 5
NET_I  2449 0   40 0    0    0
                 E
```

NETWORK SEARCHING IN A MOBILE COMMUNICATION TERMINAL

CROSS-REFERENCE TO RELATED APPLICATIONS

This application claims the benefit of Korean Patent Application No. 10-2005-0084276, filed on Sep. 9, 2005, which is hereby incorporated by reference in its entirety.

BACKGROUND OF THE INVENTION

1. Field of the Invention

The present invention relates to a mobile communication terminal. More particularly, embodiments of the present invention are directed to methods for searching a network using a mobile communication terminal.

2. Discussion of the Related Art

Figure 1:
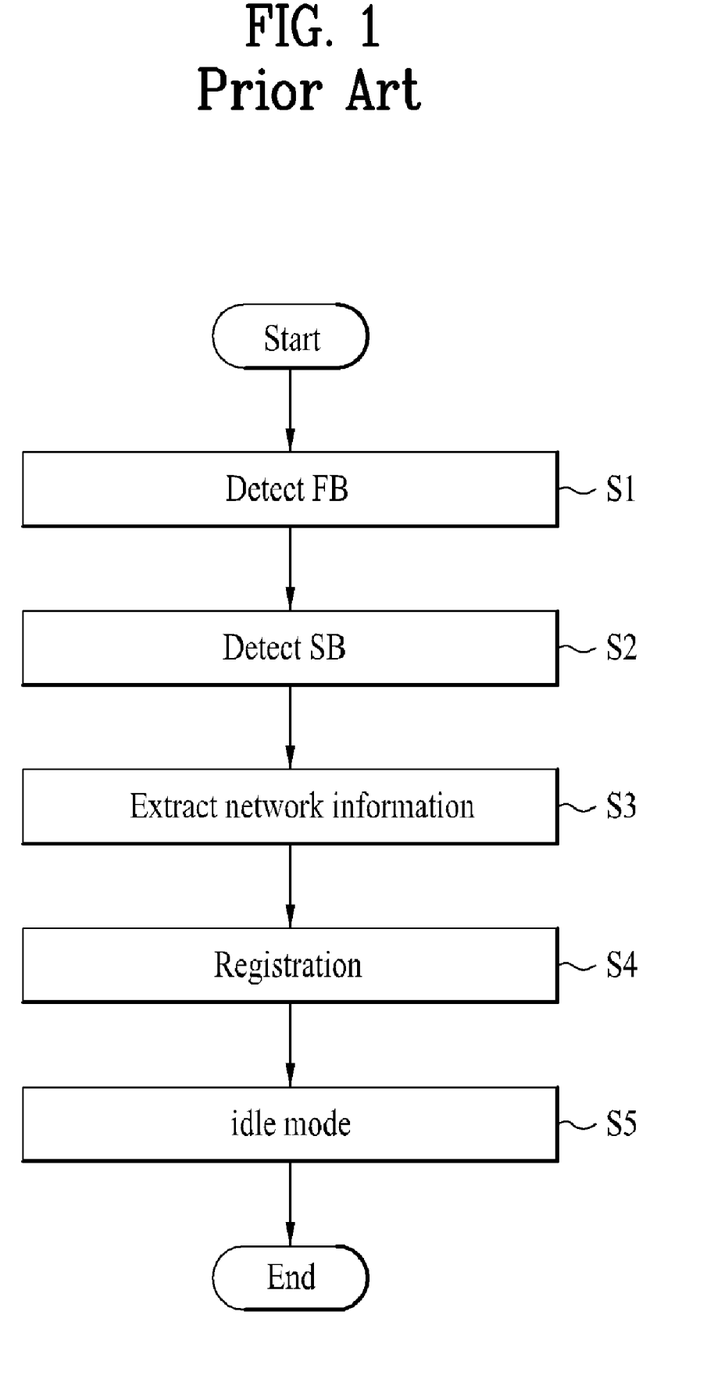
FIG. 1 is a flow chart disclosing a general method for recognizing a base station network in a mobile communication terminal.

Typically, a mobile communication terminal, such as a wireless telephone or personal digital assistant (PDA) telephone, must recognize a base station network in order to communicate with another base station. FIG. 1 illustrates one example of a general process for controlling a mobile communication terminal to recognize a base station network.

When the mobile communication terminal is powered on, the mobile communication terminal searches for a physical channel in an order of descending power levels in order to detect a Frequency Burst (FB) to carry out frequency synchronization at step S1. If the mobile communication terminal detects the FB at S1, the mobile communication terminal then detects a synchronization burst (SB) channel to be synchronized with the FB at S2. The mobile communication terminal next reads system data and cell data, and extracts network information specific to the physical location where the mobile communication terminal is currently located. This is denoted at S3. Thereafter, the mobile communication terminal performs registration at S4, and is then switched to an idle mode at step S5.

Typically, when a mobile communication terminal equipped with a temperature compensation crystal oscillator (TCXO) scans a signal channel to search for a frequency burst channel, the mobile communication terminal uses a fixed automatic frequency correct (AFC) value stored in a memory location. The mobile communication terminal generally searches for the signal channel a total of four times, such that a maximum search time of about 30 seconds elapses.

In contrast to a TCXO, a digitally controlled crystal oscillator (DCXO) is not equipped with a temperature compensation function. When a mobile communication terminal employing a DCXO scans a signal channel to search for a frequency burst channel, the mobile communication terminal generally searches the signal channel a total of 12 times using various AFC (Automatic Frequency Correct) values. In more detail, the mobile communication terminal searches the signal channel using a first AFC value ($AFC_{CENTER}$) four times, searches using a second AFC value ($AFC_{MAX}$) four times, and searches using a third AFC value ($AFC_{MIN}$) four times.

Figure 2:
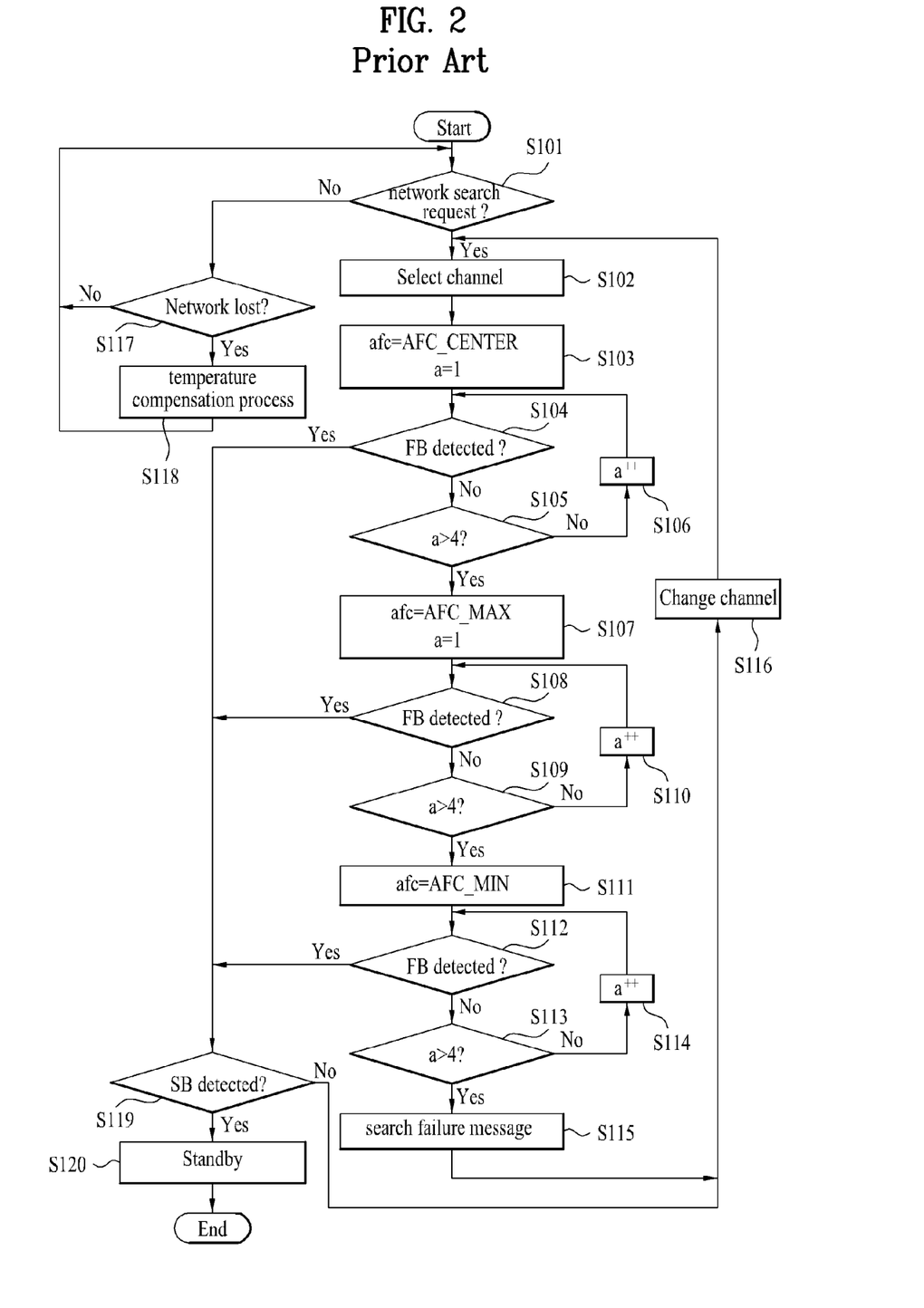
FIG. 2 is a flow chart disclosing a conventional network search method.

FIG. 2 discloses an example of a conventional network search method. If a code signal represents a network search request at S101, a mobile communication terminal selects one of the channels contained in a channel list at S102. The mobile communication terminal then sets an AFC value to a specific value of $AFC_{CENTER}$ at S103, and searches for the network until detecting a frequency burst (FB) at most four times at S104, S105, and S106.

If the mobile communication terminal fails to detect the FB after searching four times, it changes the AFC value to $AFC_{MAX}$ at S107, and searches for the FB four times at s S108, S109, and S110. If the mobile communication terminal fails to detect the FB while searching for the FB four times using $AFC_{MAX}$ as the AFC value, it changes the AFC value to $AFC_{MIN}$ at S111, and searches for the FB four times at S112, S113, and S114.

If the mobile communication terminal applies all the values of $AFC_{CENTER}$, $AFC_{MAX}$, and $AFC_{MIN}$ to a signal channel, and fails to detect the FB after searching for the FB four times using each of the values $AFC_{CENTER}$, $AFC_{MAX}$, and $AFC_{MIN}$, the mobile communication terminal transmits a search failure message at S115, changes the current channel to another channel at S116, and returns to the frequency search routines S102-S114.

Alternatively, if the mobile communication terminal successfully detects the FB, it searches for a synchronization burst (SB) channel to be synchronized with the FB at S119. If the mobile communication terminal successfully detects the SB channel, it is switched to an idle mode at S120. If the mobile communication terminal fails to detect the SB channel, it changes a current channel to another channel at S116, and returns to the frequency search routines S102-S114.

If the mobile communication terminal fails to detect the frequency burst (FB) after searching through all of the channels contained in the channel list, it generates a network lost signal.

If a code signal at S101 does not represent a network search request, the mobile communication terminal checks for a network lost signal. If the mobile communication terminal detects a network lost signal at S117, the mobile communication terminal executes a temperature compensation process to compensate for an incorrect oscillator frequency caused by heat encountered during the frequency search method at S118.

As described above, the mobile communication terminal equipped with the DCXO searches for a FB associated with a signal channel a total of 12 times (i.e., $AFC_{CENTER}$ (4 times), $AFC_{MAX}$ (4 times), or $AFC_{MIN}$ (4 times)). As a result, a total search time consumed from a "No Service" state to a specific time at which the mobile communication terminal re-performs the network search method is about 1 minute and 30 seconds, which is a relatively long network search time. Therefore, although including a DCXO with a mobile communication terminal reduces the cost of production of the mobile communication terminal, this also results in users of the mobile communication terminal experiencing greater inconvenience due to long network search times.

SUMMARY OF THE INVENTION

Accordingly, the present invention relates to an improved network search method for use in a mobile communication terminal. Example embodiments of the present invention reduce a network search time of a mobile communication terminal employing a digitally controlled crystal oscillator (DCXO) that is not equipped with a temperature compensation circuit. Example embodiments of the present invention also reduce unnecessary power consumption during a network search time of a mobile communication terminal, resulting in an increased battery lifetime.

In one example embodiment, a mobile communication terminal employing a Digitally Controlled Crystal Oscillator (DCXO) performs a network search method including the act of searching for a frequency using a value stored in an Automatic Frequency Control (AFC) mode.

In another example embodiment, a mobile communication terminal employing a Digitally Controlled Crystal Oscillator (DCXO) performs a network search method including the acts of: a) setting an Automatic Frequency Control (AFC) mode value according to a network search request of the mobile communication terminal; b) changing a channel of a channel list to another channel using the AFC mode value; c) detecting a frequency burst signal and a synchronization burst signal; and d) changing an AFC mode to another mode according to a network lost message.

In yet another example embodiment, a network search method includes the acts of: a) selecting a channel contained in a channel list according to a network search request; b) searching for a frequency burst synchronized with a network using a current automatic frequency control (AFC) mode value; c) if the frequency burst is not detected before searching a predetermined number of times, outputting corresponding information, changing a current channel, and returning to a frequency search routine using the changed channel value; d) if the frequency burst synchronized with the network is successfully detected, searching for a synchronization burst; and e) upon receiving a network lost message on the condition that the frequency burst synchronized with the network is not detected, changing the AFC mode value.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, disclose embodiment(s) of the invention and together with the description serve to explain the principle of the invention. In the drawings.

DETAILED DESCRIPTION OF EXAMPLE EMBODIMENTS

Reference will now be made in detail to embodiments of the present invention, examples of which are disclosed in the accompanying drawings. Wherever possible, the same reference numbers will be used throughout the drawings to refer to the same or like parts.

Figure 3:
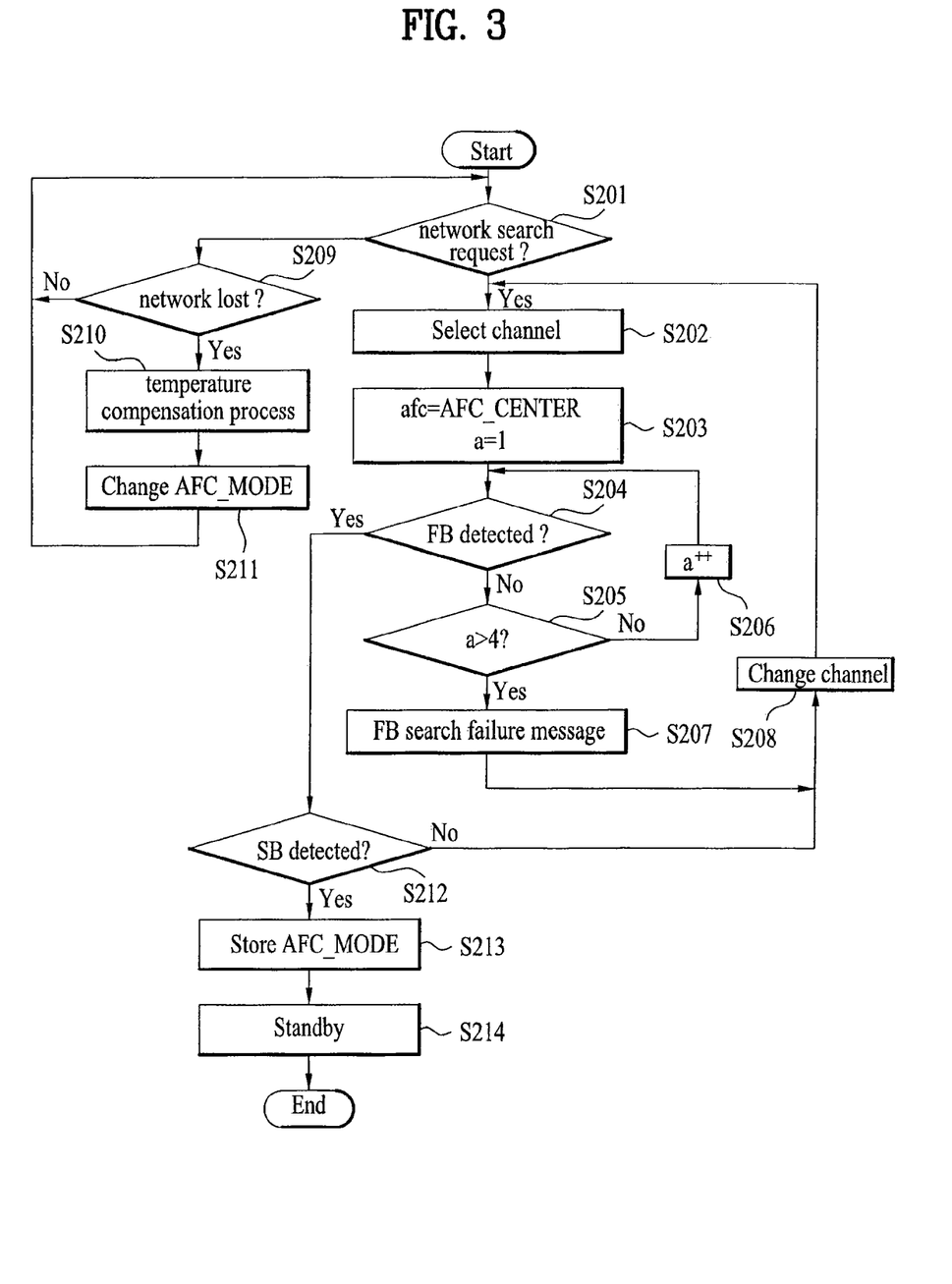
FIG. 3 is a flow chart disclosing an example network search method according to the present invention.

Reference is first made to FIG. 3, which discloses one example of a network search method. The example network search method of FIG. 3 enables a mobile communication terminal to establish/fix synchronization between frequency and synchronization signals transferred from a network. The mobile communication terminal can thereby establish synchronization with the network, such that a user of the mobile communication terminal can communicate with another party over the network.

In disclosed embodiments, the mobile communication terminal searches for the frequency burst (FB) by changing an automatic frequency control mode (AFC_MODE) value to another value. Further, if the mobile communication terminal completely searches for a synchronization burst channel after searching for a frequency burst channel, it determines a current AFC value, and stores the determined AFC value as a specific value (AFC_MODE).

In illustrated embodiments, the AFC_MODE value is determined to be either one of $AFC_{MAX}$, $AFC_{CENTER}$, and $AFC_{MIN}$. The stored AFC value is used for searching for the next network.

Beginning at S201, if a code signal is determined to constitute a network search request, the mobile communication terminal selects one of the channels contained in a channel list, as is denoted at S202.

The mobile communication terminal sets the stored AFC_MODE to an automatic frequency control (AFC) value at S203. If no value is stored in the AFC_MODE, the mobile communication terminal selects the value of $AFC_{CENTER}$.

The mobile communication terminal then searches for a frequency burst (FB) until detecting a FB or until the mobile communication terminal has searched a predetermined number of times (here, four times) at S204, S205, and S206.

If the mobile communication terminal fails to detect the frequency burst (FB) using the AFC_MODE value, it outputs a search failure message at S207, and outputs a channel change signal at S208.

If the mobile communication terminal does detect the frequency burst FB, it then searches for a synchronization burst SB at S212.

If the mobile communication terminal fails to detect the synchronization burst at S212, it changes a current channel to the next channel at S208, and returns to the steps S202-S206 to perform the frequency search method.

If the mobile communication terminal fails to detect the synchronization burst after searching through all the channels contained in the channel list, the mobile communication terminal generates a network lost signal.

If a received code signal is determined to be the network lost signal at S209, the mobile communication terminal executes a temperature compensation process to compensate for an incorrect oscillator frequency caused by heat encountered during the frequency search method, as is denoted at S210.

Thereafter, the mobile communication terminal changes a current AFC_MODE value to another AFC_MODE value at S211. By way of example, this can be accomplished according to the following rules: If a current AFC_MODE value is determined to be $AFC_{CENTER}$, the value of $AFC_{CENTER}$ is changed to the value of $AFC_{MAX}$. If a current AFC_MODE value is determined to be $AFC_{MAX}$, the value of $AFC_{MAX}$ is changed to the value of $AFC_{MIN}$. Finally, if a current AFC_MODE value is determined to be $AFC_{MIN}$, the value of $AFC_{MIN}$ is changed to the value of $AFC_{CENTER}$.

If the mobile communication terminal successfully detects the synchronization burst at S212, it resets the AFC_MODE value according to an AFC value acquired at the search time of the synchronization burst channel at S213, and is switched to the idle mode at S214.

Figure 4:
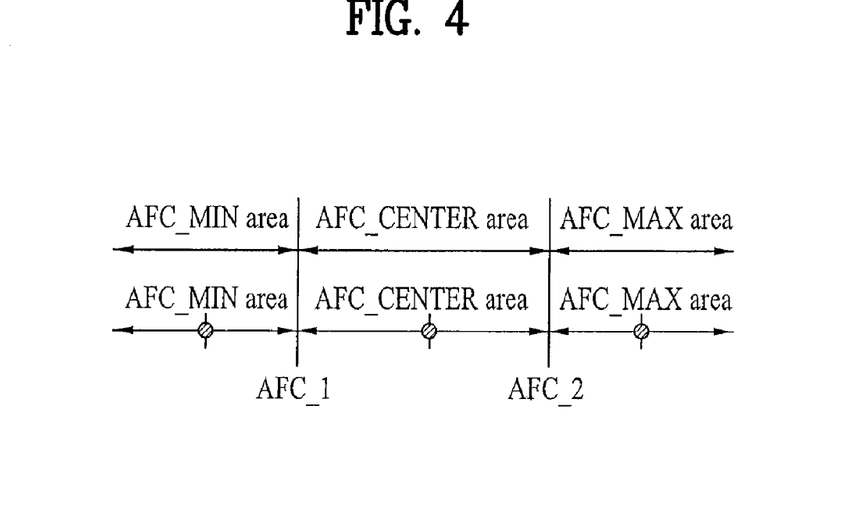
FIG. 4 is an exemplary conceptual diagram disclosing an example method for determining/storing an AFC mode (AFC_MODE) according to the present invention.

One example of a method for resetting the AFC_MODE value is based on a mode discrimination diagram shown in FIG. 4.

In the example embodiment, the AFC value is classified into three areas, namely, $AFC_{MIN}$, $AFC_{CENTER}$, and $AFC_{MAX}$ values. A first reference value $AFC_1$ discriminates between the value of $AFC_{CENTER}$ and the value of $AFC_{MIN}$ according to Equation 1:

$$AFC_1 = AFC_{CENTER} - (AFC_{CENTER} - AFC_{MIN})/2 \quad \text{[Equation 1]}$$

A second reference value $AFC_2$ discriminates between the value of $AFC_{CENTER}$ and the value of $AFC_{MAX}$ according to Equation 2:

$$AFC_2 = AFC_{CENTER} - (AFC_{MAX} - AFC_{CENTER})/2 \quad \text{[Equation 2]}$$

For example, if the value of $AFC_{CENTER}$ is set to "5", the value of $AFC_{MAX}$ is set to "3000", and the value of $AFC_{MIN}$ is set to "−3350", the value of $AFC_1$ according to Equation 1 will be "−1672" and the value of $AFC_2$ according to Equation 2 will be "1502". In this example, the individual numerical values are not equal to absolute values, and are acquired by quantization of relative magnitudes.

Thereafter, if the network lost message occurs, the mobile communication terminal searches for the frequency burst channel using the AFC_MODE value stored at the search time of the synchronization burst channel.

If a current AFC_MODE value is the value of $AFC_{MIN}$, and the AFC value acquired when the synchronization burst has been detected is determined to be "−95", the value of $AFC_{CENTER}$ is stored as the AFC_MODE value in a Random Access Memory (RAM) of the mobile communication terminal.

Figure 5:
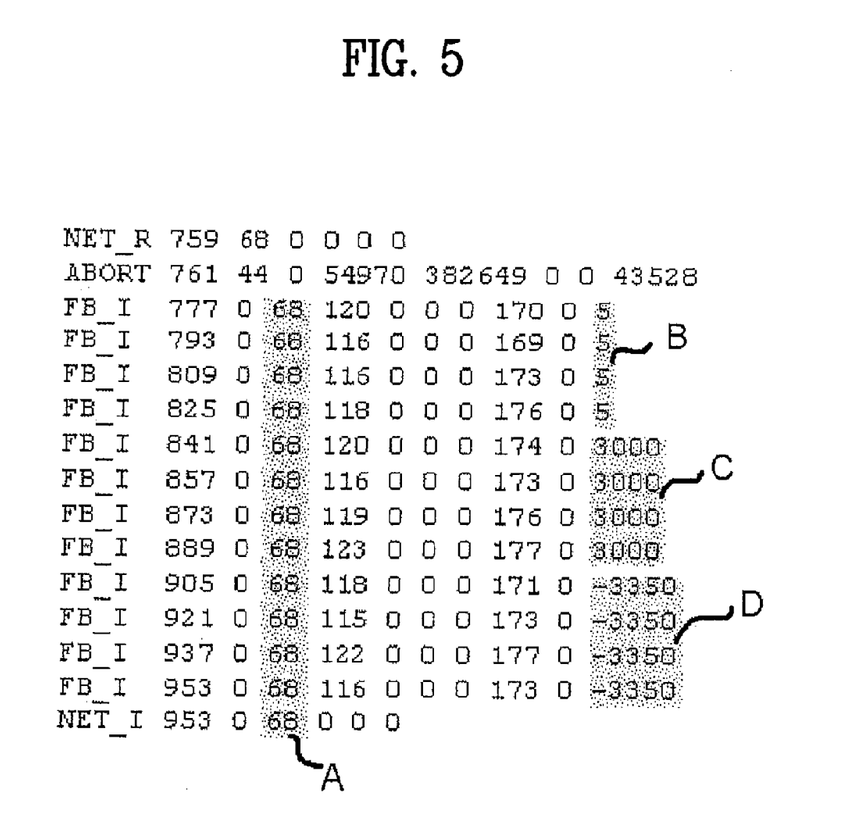
FIG. 5 exemplarily discloses a trace message caused by a network search algorithm using a conventional DCXO.
Figure 6:
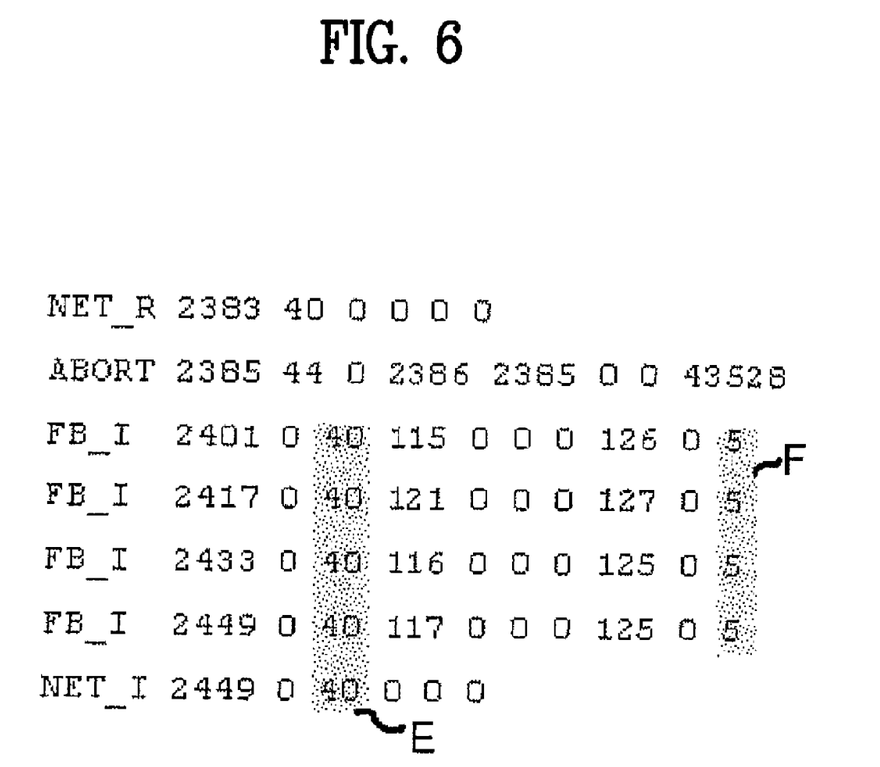
FIG. 6 exemplarily discloses a trace message caused by a network search algorithm employing a DCXO according to the present invention.

One example of a network search algorithm that is capable of performing a temperature compensation function using the DCXO unequipped with a temperature compensation circuit is shown in FIGS. 5 and 6.

FIG. 5 discloses an example trace message generated by a network search algorithm using a conventional DCXO. FIG. 6 discloses an example trace message generated by a network search algorithm employing a DCXO according to the present invention.

FIG. 5 discloses a method for searching for a signal channel selected from among channels recorded in a Broadcasting channel Array list according to a network synchronization request.

Referring to FIG. 5, a first area "A" represents a current search channel, a second area "B" represents the value of $AFC_{CENTER}$, a third area "C" represents the value of $AFC_{MAX}$, and a fourth area "D" represents the value of $AFC_{MIN}$. In this way, the mobile communication terminal changes the AFC value associated with a signal channel a total of 12 times (i.e., $AFC_{CENTER}$ (4 times), $AFC_{MAX}$ (4 times), or $AFC_{MIN}$ (4 times)), such that it can establish synchronization with the network.

Referring to FIG. 6, a first area "E" represents a current search channel and a second area "F" represents the value of $AFC_{CENTER}$. In this way, the mobile communication terminal searches for the frequency burst associated with a specific channel "40" at the $AFC_{CENTER}$ mode a total of four times in FIG. 6, instead of 12 times in FIG. 5.

As apparent from the above description, a network search method according to the present invention controls a network search time of a mobile communication terminal employing a DCXO unequipped with a temperature compensation circuit to be equal to that of another mobile communication terminal employing a TCXO.

Therefore, a manufacturer of the mobile communication terminal can greatly reduce the cost of production, and a user of the mobile communication terminal can reduce unnecessary power consumption required for the network search method, resulting in an increased battery lifetime.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. In a mobile communication terminal employing a Digitally Controlled Crystal Oscillator (DCXO), a network search method comprising:

searching for a frequency burst using a value stored in an Automatic Frequency Control (AFC) model if the frequency burst is detected, searching for a synchronization burst channel at most a predetermined number of times;

if the frequency burst is not detected during the act of searching for a synchronization burst channel at most a predetermined number of times, transmitting a search failure message, changing a current channel to another channel, and searching for the frequency burst; and resetting an AFC mode value on the basis of an AFC value acquired when the frequency burst and the synchronization burst channel are detected.

2. The method according to claim 1, wherein the AFC mode is established by an AFC value acquired when the synchronization burst channel is detected.

3. In a mobile communication terminal employing a Digitally Controlled Crystal Oscillator (DCXO), a network search method comprising the acts of:

a) selecting a signal channel from among a channel list;

b) reading an Automatic Frequency Control (AFC) value;

c) setting an AFC mode value according to a network search request of the mobile communication terminal;

d) searching for a frequency burst at most a predetermined number of times;

e) detecting the frequency burst and a synchronization burst channel;

f) if the frequency burst is not detected during the act e), transmitting a search failure message, changing the current channel to another channel, and returning to the act b);

g) if the frequency burst is detected during the act e), searching for the synchronization burst channel;

h) resetting the AFC mode value on the basis of the AFC value acquired when the synchronization burst channel is detected;

i) changing an AFC mode to another mode according to a network lost message.

4. The method according to claim 3, wherein the act d includes the act of:

searching for the frequency burst at most four times for each signal channel selected at the act a).

5. The method according to claim 3, wherein the act c) includes the act of:

employing a specific AFC value $AFC_{CENTER}$ if no value is set to the AFO mode value.

6. The method according to claim 3, wherein the act i) includes the acts of:

compensating for frequency deviation caused by heat generated by an oscillator operation; and changing a current AFC mode to another mode according to a predetermined mode change rule.

7. The method according to claim 6, wherein the mode change rule:
  changes the current AFC mode to $AFC_{MAX}$ if the current AFC mode value is determined to be $AFC_{CENTER}$;
  changes the current AFC mode to $AFC_{MIN}$ if the current AFC mode value is determined to be $AFC_{MAX}$;
  changes the current AFC mode to $AFC_{CENTER}$ if the current AFC mode value is determined to be $AFC_{MIN}$.

8. The method according to claim 3, wherein the DCXO performs temperature compensation using software.

9. A network search method comprising the acts of:
  a) selecting a channel contained in a channel list according to a network search request;
  b) searching for a frequency burst synchronized with a network using a current automatic frequency control (AFC) mode value;
  c) if the frequency burst is not detected while searching a predetermined number of times, for the search burst outputting corresponding information, changing a current channel to another channel, and returning to searching for a frequency burst synchronized with the network using the changed channel value;
  d) if the frequency burst synchronized with the network is successfully detected, searching for a synchronization burst channel;
  e) resetting the AFC mode value on the basis of the AFC value acquired when the synchronization burst channel is detected; and
  f) upon receiving a network lost message on the condition that the frequency burst synchronized with the network is not detected, changing the AFC mode value.

* * * * *

UNITED STATES PATENT AND TRADEMARK OFFICE
CERTIFICATE OF CORRECTION

| | | |
|---|---|---|
| PATENT NO. | : 7,643,806 B2 | Page 1 of 1 |
| APPLICATION NO. | : 11/470474 | |
| DATED | : January 5, 2010 | |
| INVENTOR(S) | : Hyung Suk Oh | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 582 days.

Signed and Sealed this

Sixteenth Day of November, 2010

David J. Kappos
*Director of the United States Patent and Trademark Office*